United States Patent
Blosse et al.

(10) Patent No.: US 6,869,850 B1
(45) Date of Patent: Mar. 22, 2005

(54) SELF-ALIGNED CONTACT STRUCTURE WITH RAISED SOURCE AND DRAIN

(75) Inventors: Alain Blosse, Belmont, CA (US); Krishnaswamy Ramkumar, San Jose, CA (US)

(73) Assignee: Cypress Semiconductor Corporation, San Jose, CA (US)

(*) Notice: Subject to any disclaimer, the term of this patent is extended or adjusted under 35 U.S.C. 154(b) by 0 days.

(21) Appl. No.: 10/326,525

(22) Filed: Dec. 20, 2002

(51) Int. Cl.[7] .................................. H01L 21/336
(52) U.S. Cl. .......................................... 438/299
(58) Field of Search ............... 438/299–303; 257/344, 382

(56) References Cited

U.S. PATENT DOCUMENTS

| | | | |
|---|---|---|---|
| 4,885,617 A | * | 12/1989 | Mazure-Espejo et al. ... 257/384 |
| 5,798,278 A | * | 8/1998 | Chan et al. .................. 438/300 |
| 5,804,846 A | * | 9/1998 | Fuller .......................... 257/252 |
| 6,027,961 A | * | 2/2000 | Maiti et al. .................. 438/199 |
| 6,724,057 B2 | * | 4/2004 | Ibara et al. .................. 257/412 |

OTHER PUBLICATIONS

Chang, Hsiao–Yung "Modeling and Simulation of a Tungten Chemical Vapor Deposition Reactor" Aug. 1, 2000 (Abstract) pp. 1–154, University of Maryland, College Park.

Kobayashi, Nobuyoshi, et al. "Study on mechanism of selective chemical vapor deposition of tungsten using in situ infrared spectroscopy and Auger electron spectroscopy", 1991, pp. 1013–1019, vol. 69, No. 2, Journal of Applied Physics; Japan.

* cited by examiner

*Primary Examiner*—Hung Vu
(74) *Attorney, Agent, or Firm*—Okamoto & Benedicto LLP

(57) ABSTRACT

In one embodiment, a transistor comprises raised structures over a source region and a drain region. The raised source structures may comprise selectively deposited metal, such as selective tungsten. A self-aligned contact structure formed through a dielectric layer may provide an electrical connection between an overlying structure (e.g., an interconnect line) and the source or drain region. The transistor may further comprise a gate stack having a capping layer over a metal.

16 Claims, 5 Drawing Sheets

US 6,869,850 B1

SELF-ALIGNED CONTACT STRUCTURE WITH RAISED SOURCE AND DRAIN

BACKGROUND OF THE INVENTION

1. Field of the Invention

The present invention relates generally to integrated circuits, and more particularly but not exclusively to integrated circuit fabrication processes and structures.

2. Description of the Background Art

As is well known, a metal oxide semiconductor (MOS) transistor comprises a source, a drain, and a gate. The source and the drain are typically formed in a substrate, such as a silicon substrate. Dopants are implanted and activated in the substrate to form a source region and a drain region, which serve as the source and the drain, respectively. The gate is formed over the substrate between the source and the drain.

Contact structures may be formed through a dielectric layer to allow an overlying structure (e.g., an interconnect line) to make an electrical connection with the source or the drain. These contact structures are typically filled with a tungsten plug. One problem with conventional MOS transistors is that as the aspect ratio of a contact structure increases, it becomes more difficult to clean the bottom of the contact structure. It is also relatively difficult to obtain good step coverage when depositing a liner on the sidewalls and bottom of a contact structure that has a high aspect ratio.

SUMMARY

In one embodiment, a transistor comprises raised structures over a source region and a drain region. The raised source structures may comprise selectively deposited metal, such as selective tungsten. A self-aligned contact structure formed through a dielectric layer may provide an electrical connection between an overlying structure (e.g., an interconnect line) and the source or drain region. The transistor may further comprise a gate stack having a capping layer over a metal.

These and other features of the present invention will be readily apparent to persons of ordinary skill in the art upon reading the entirety of this disclosure, which includes the accompanying drawings and claims.

The use of the same reference label in different drawings indicates the same or like components. Drawings are not necessarily to scale unless otherwise noted.

DETAILED DESCRIPTION

In the present disclosure, numerous specific details are provided such as examples of materials, process steps, and structures to provide a thorough understanding of embodiments of the invention. Persons of ordinary skill in the art will recognize, however, that the invention can be practiced without one or more of the specific details. In other instances, well-known details are not shown or described to avoid obscuring aspects of the invention.

Figure 1:
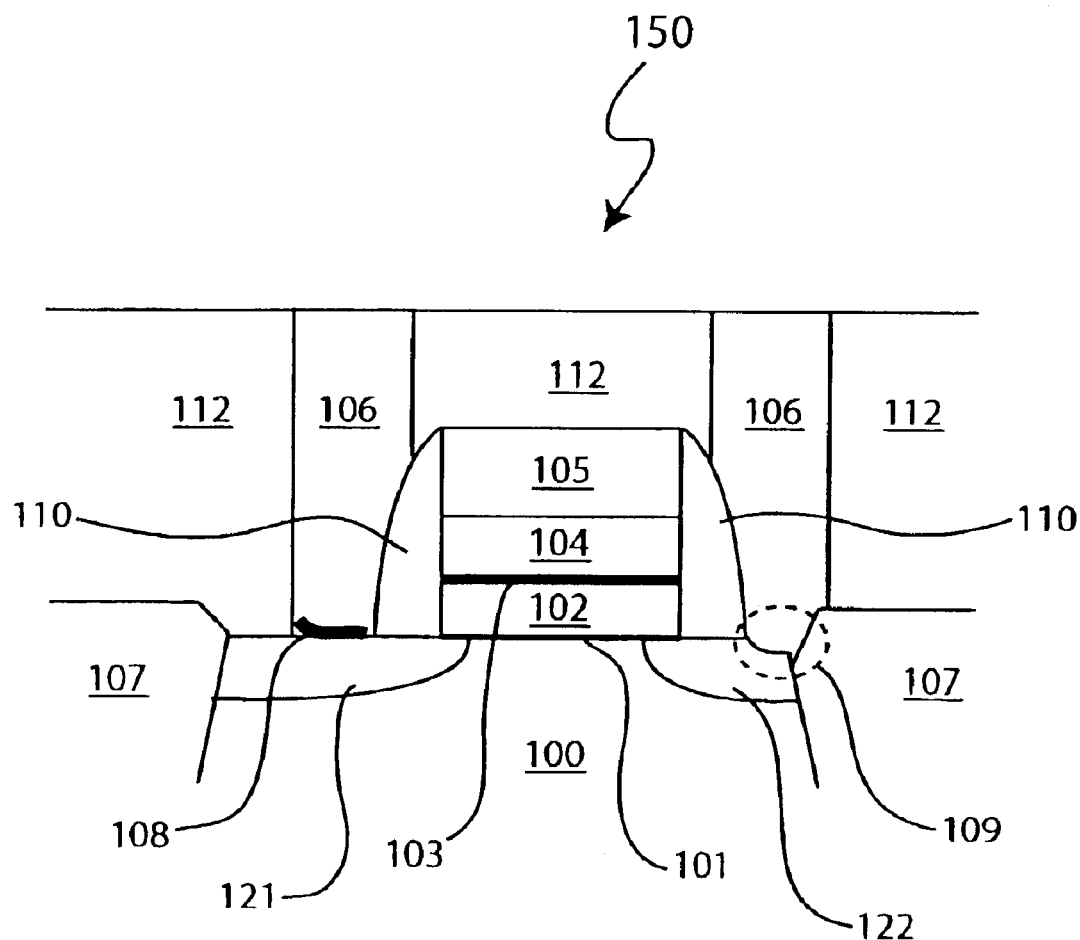
FIG. 1 shows a cross-sectional view schematically illustrating a MOS transistor.

FIG. 1 shows a cross-sectional view schematically illustrating a MOS transistor 150. Transistor 150 includes a source region 121, a drain region 122, and a gate stack comprising a gate oxide layer 101, a gate polysilicon layer 102, a barrier layer 103, a metal layer 104, and a capping layer 105. Gate oxide layer 101 and gate polysilicon layer 102 serve as the gate of transistor 150, while metal layer 104 electrically couples the gate to other transistors not shown. Barrier layer 103 prevents cross-diffusion between gate polysilicon layer 102 and another gate polysilicon layer by way of metal layer 104. Capping layer 105 advantageously protects metal layer 104 and the gate from overlying materials and during processing steps. As will be more apparent below, capping layer 105 also advantageously allows for the formation of a self-aligned contact structure by serving as an electrical insulator for the gate stack.

As shown in FIG. 1, source region 121 and drain region 122 are formed in a substrate 100. Substrate 100 may be a silicon substrate. Also formed in substrate 100 are shallow trench isolation (STI) structures 107, which isolate transistor 150 from other transistors. STI structures 107 are preferable to LOCOS structures because STI allows for higher device density.

Self-aligned contact (SAC) structures 106 are formed through a dielectric layer 112 to allow an overlying structure, such as an interconnect line, metal layer, or a lead wire, to make an electrical connection with source region 121, drain, region 122, or both. Unlike other types of contact structures, portions of SAC structures 106 may touch portions of the gate stack without creating an electrical short with metal layer 104. This is made possible by having capping layer 105, which electrically insulates the gate stack. SAC structures 106 may thus be formed with some margin for misalignment.

Although transistor 150 has several advantages over other MOS transistors, transistor 150 may be further improved. One problem with transistor 150 is that as the aspect ratio of a contact structure 106 is increased, it becomes more difficult to clean its bottom portion. This may result in accumulation of polymer residue 108, which may block a self-aligned contact etch step before reaching substrate 100. It is also relatively difficult to obtain good deposition step coverage with a SAC structure 106 that has a high aspect ratio. As can be appreciated, obtaining good step coverage is important when depositing a liner (not shown) in a SAC structure 106 prior to deposition of a tungsten plug. Another problem with transistor 150 is that it is susceptible to trench corner degradation and substrate gouging shown in dashed circle 109. Transistor 150 is also susceptible to excessive rounding of the corners of spacers 110.

FIGS. 2(a)–2(h) show cross-sectional views schematically illustrating the fabrication of a metal oxide semiconductor (MOS) transistor in accordance with an embodiment of the present invention. As can be appreciated by those of ordinary skill in the art reading the present disclosure, the transistor being fabricated may be an NMOS transistor or a PMOS transistor depending on dopants employed in implantation steps. Details of such implantation steps and associated activation steps are not further described herein as they are known in the art and are not necessary to the understanding of the present invention. Additionally, note that the transistor being fabricated may be coupled to a complementary transistor or other transistors not specifically shown.

Figure 2A:
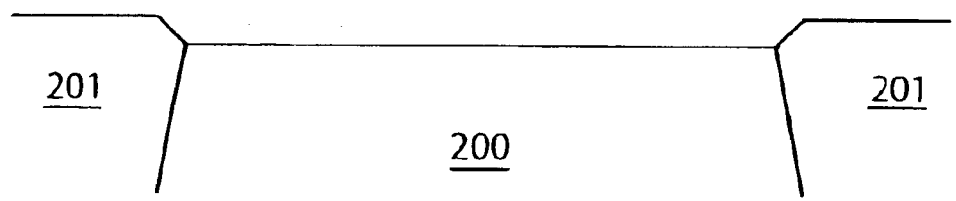
FIGS. 2(a)–2(h) show cross-sectional views schematically illustrating the fabrication of a metal oxide semiconductor (MOS) transistor in accordance with an embodiment of the present invention.

In FIG. 2(a), isolation structures 201 are formed in a substrate 200. Isolation structures 201 may be shallow trench isolation (STI) structures, for example. Isolation structures 201 may be filled with a field oxide, such as silicon dioxide. Substrate 200 may comprise silicon.

Figure 2B:
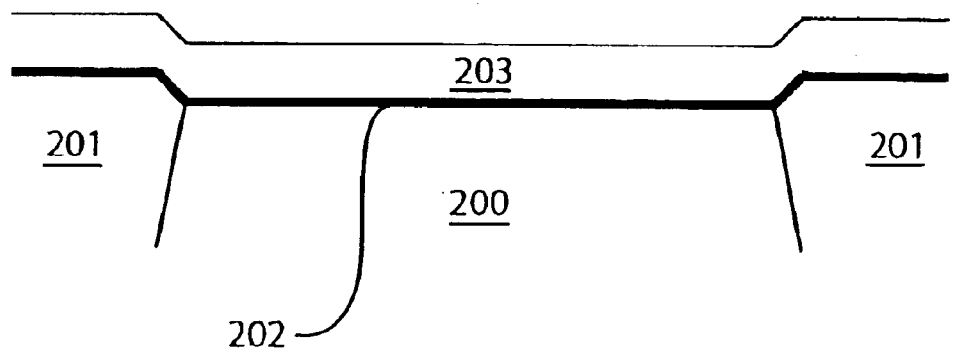

In FIG. 2(b), a gate oxide layer 202 is formed over substrate 200. In one embodiment, gate oxide layer 202 is thermally grown to a thickness of about 20 Angstroms.

Also in FIG. 2(b), a gate polysilicon layer 203 is formed over gate oxide layer 202. In one embodiment, gate polysilicon layer 203 is formed by depositing a layer of amorphous silicon to a thickness of about 800 Angstroms by low pressure chemical vapor deposition (LPCVD). The layer of amorphous silicon is then doped to form gate polysilicon layer 203. Gate polysilicon layer 203 and gate oxide layer 202 will be subsequently etched to form a gate for the transistor being fabricated. Depending on the application, layer 203 may also be a layer of polycrystalline silicon-germanium (poly SiGE) or metal.

It is to be noted that as used in the present disclosure, the terms "over", "overlying", "under" and "underlying" refer to the relative placement of two materials that may or may not be directly in contact with each other. That is, the two materials may be separated by another material. For example, depending on the application, another material may be formed between gate polysilicon layer 203 and gate oxide layer 202.

Figure 2C:
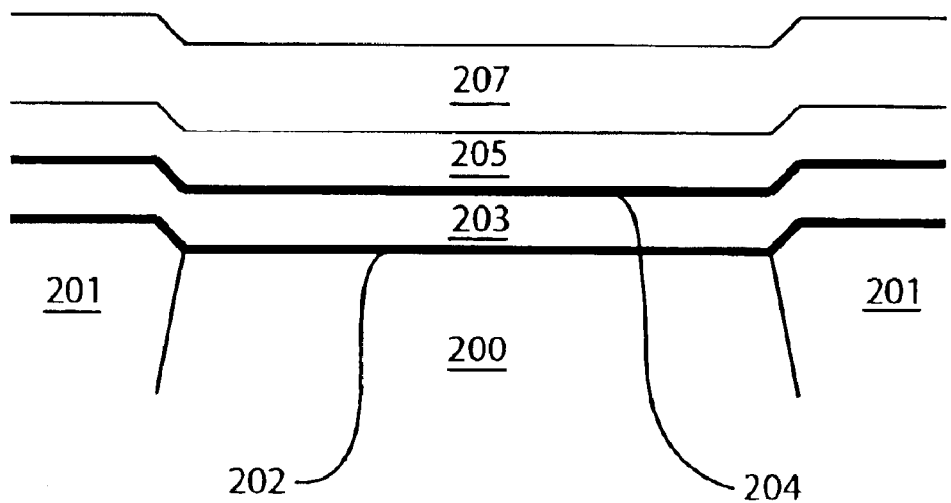

In FIG. 2(c), a metal stack comprising a barrier layer 204 and a metal layer 205 is formed over gate polysilicon layer 203. The metal stack may be employed to couple two gate polysilicon layers, which may have different doping.

In one embodiment, barrier layer 204 comprises a bilayer of a refractory metal (e.g., titanium, tantalum) and a refractory nitride (e.g., titanium-nitride, tantalum-nitride, tungsten-nitride) deposited to a thickness of about 50 Angstroms, while metal layer 205 comprises tungsten deposited to a thickness of about 400 Angstroms. Barrier layer 204 and metal layer 205 may be deposited by physical vapor deposition (PVD). Barrier layer 204 advantageously prevents cross-diffusion of dopants from gate polysilicon layer 203 to a gate polysilicon layer of another transistor. This is specially beneficial in applications where the metal stack serves as a conductive line coupling an N-type gate to a P-type gate, for example.

Unlike a polysilicon layer, metal layer 205 is naturally conductive and does not need implantation and activation steps. Metal layer 205 also has relatively low resistance compared to a polysilicon layer. A metal layer 205 of tungsten and a barrier layer 204 of tungsten nitride may be deposited in-situ (i.e., without vacuum break) using a PVD cluster tool of the type available from Applied Materials, Inc. of Santa Clara, Calif. As can be appreciated, in-situ deposition advantageously allows for efficient and cost-effective process flow.

Also in FIG. 2(c), a capping layer 207 is formed over metal layer 205. In one embodiment, capping layer 207 comprises silicon nitride deposited to a thickness of about 2000 Angstroms, and a final thickness of about 1200 Angstroms. A capping layer 207 of silicon nitride may be deposited by plasma-enhanced chemical vapor deposition (PECVD) at a temperature of about 400° C. A capping layer 207 of silicon nitride may also be deposited using an LPCVD process at a relatively low-temperature (e.g., about 600° C. or less, preferably about 550° C.) to prevent unwanted reactions in an underlying metal layer 205 of tungsten.

Figure 2D:
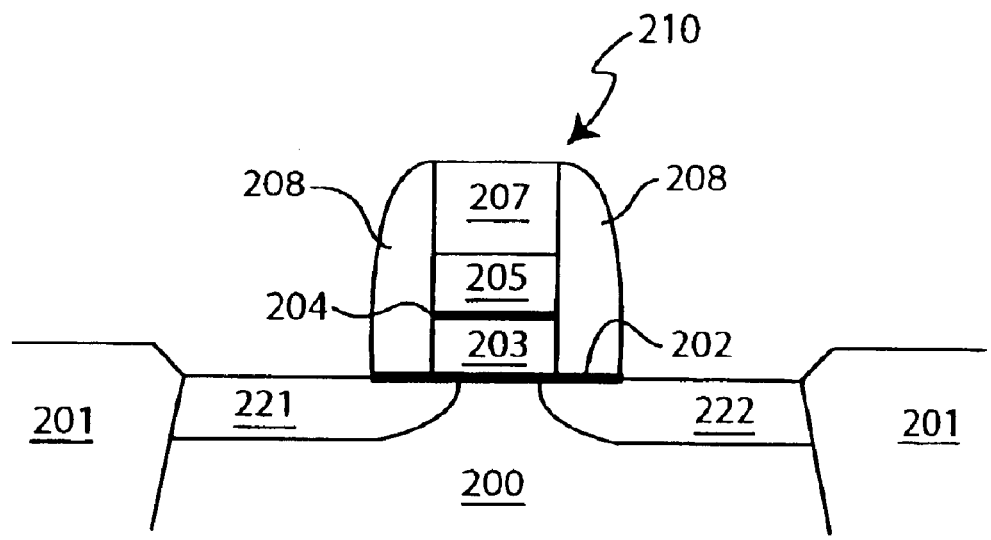

In FIG. 2(d), a gate stack 210 is formed by etching capping layer 207, metal layer 205, barrier layer 204, and gate polysilicon 203. Spacers 208 are then formed on the sidewalls of gate stack 210. In one embodiment, spacers 208 are formed by depositing a layer of silicon nitride over patterned gate stack 210, and then blanket etching the silicon nitride to form spacers 208. Spacers 208 may be formed to a width of about 500 Angstroms, for example.

Note that an oxide layer (not shown) may be grown on the sidewalls of gate polysilicon layer 203 prior to forming spacers 208. An oxide layer on the sidewalls of gate polysilicon layer 203 helps protect gate oxide layer 202 at the foot of gate stack 210.

The formation of spacers 208 is followed by an implant step to form a source region 221 and a drain region 222. A rapid thermal anneal (RTA) step is then performed to activate implanted dopants in source region 221 and drain region 222. Source region 221 and drain region 222 serve as the source and the drain, respectively, of the transistor being fabricated.

Gate stack 210 may also be of the type disclosed in commonly-assigned U.S. patent application Ser. No. 10/186,453, entitled "GATE STACK HAVING NITRIDE LAYER", filed on Jun. 28, 2002, by Alain Blosse and Krishnaswamy Ramkumar. The just mentioned U.S. patent application is incorporated herein by reference in its entirety.

Figure 2E:
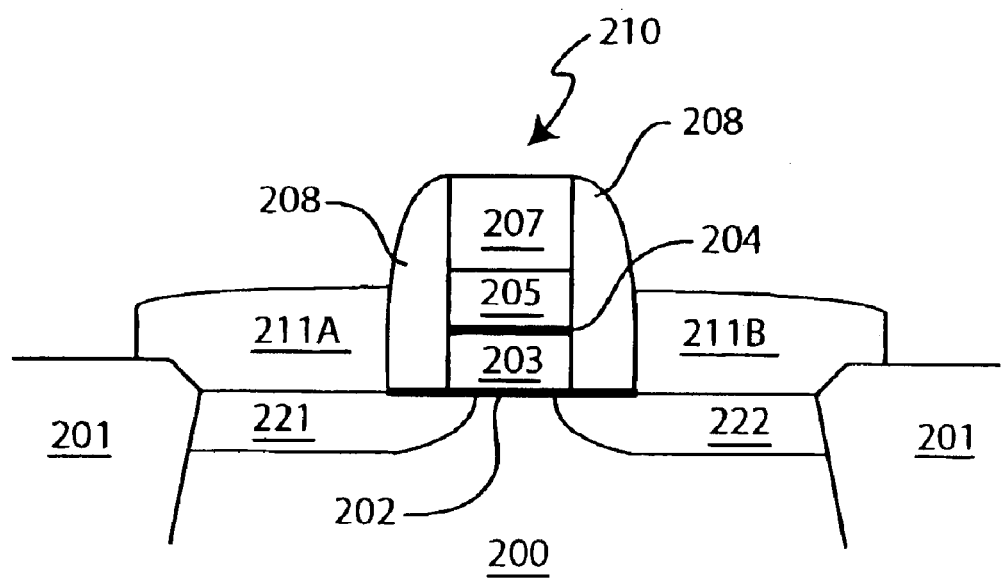

Continuing in FIG. 2(e), a raised source structure 211A and a raised drain structure 211B are formed over source region 221 and drain region 222, respectively. Raised structures-211 (i.e., raised source structure 211A and raised drain structure 211B) advantageously elevate the electrical contact surfaces of source region 221 and drain region 222. This effectively decreases the aspect ratio (i.e., ratio of height to width) of subsequently formed self-aligned contact structures, thereby alleviating aforementioned problems caused by a high aspect ratio. Additionally, because they are formed over substrate 200 and corner portions of isolation structures 201, raised structures 211 advantageously help prevent gouging of substrate 200 and rounding of the corners of isolation structures 201.

Raised structures 211 may be formed by selectively depositing a metal over source region 221 and drain region 222. That is, raised structures 211 may be formed using a selective deposition process that would deposit most of the metal over source region 221 and drain region 222; lateral growth of the metal (which is selective tungsten in one embodiment) may cover part of gate stack 210 or isolation structures 201 as shown in FIG. 2(e). Forming raised structures 211 by selective deposition of a metal has several advantages heretofore unrealized. For one, a metal raised structure allows for relatively low contact resistance compared to a non-metal raised structure (e.g., those of silicon-germanium or polysilicon). Additionally, because raised structures 211 are selectively deposited, they may be formed without having to perform costly masking and etching steps.

In one embodiment, raised structures 211 comprise a metal referred to as "selective tungsten". Selective tungsten may be selectively deposited on silicon (e.g., on substrate 200) versus silicon dioxide (e.g., on isolation structures 201) or silicon nitride (e.g., on spacers 208). Selective tungsten deposition may be performed in conjunction with an in-situ (i.e., without vacuum break) clean step using a chemistry that includes $H_2$, which helps deactivate boron on a P+ source/drain.

Raised structures 211 may have a thickness equal to about $2/3$ of the height of gate stack 210, and less than $1/3$ of the spacing between two unrelated active regions. For example, raised structures 211 of selective tungsten may be deposited to a thickness of about 600 Angstroms to 700 Angstroms by selective chemical vapor deposition (CVD). Tools for performing selective CVD are commercially available from various semiconductor manufacturing equipment vendors, such as ULVAC Japan, Ltd.

It should be noted that selective tungsten deposition, in general, is known in the art. For example, see "Diffusion Barrier Properties Of Thin Selective Chemical Vapor Deposited Tungsten Films", B. W. Shen, et al., J. Vac. Sci. Technology B 4(6), November/December 1986; "Effect Of Surface Pretreatment Of Submicron Contact Hole On Selective Tungsten Chemical Vapor Deposition", Wen-Kuan Yeh, et al., J. Vac. Sci. Technology B 14(1), January/February 1996; "Self-Aligned Tungsten Strapped Source/Drain and Gate Technology Realizing The Lowest Sheet Resistance For Sub-quarter Micron CMOS", M. Sekine, et al., 0-7803-2111-11994 IEEE (IEDM 94); and "Progress in LPCVD Tungsten For Advanced Microelectronics Applications", R. Blewer, Solid State Technology, November 1986.

Figure 2F:
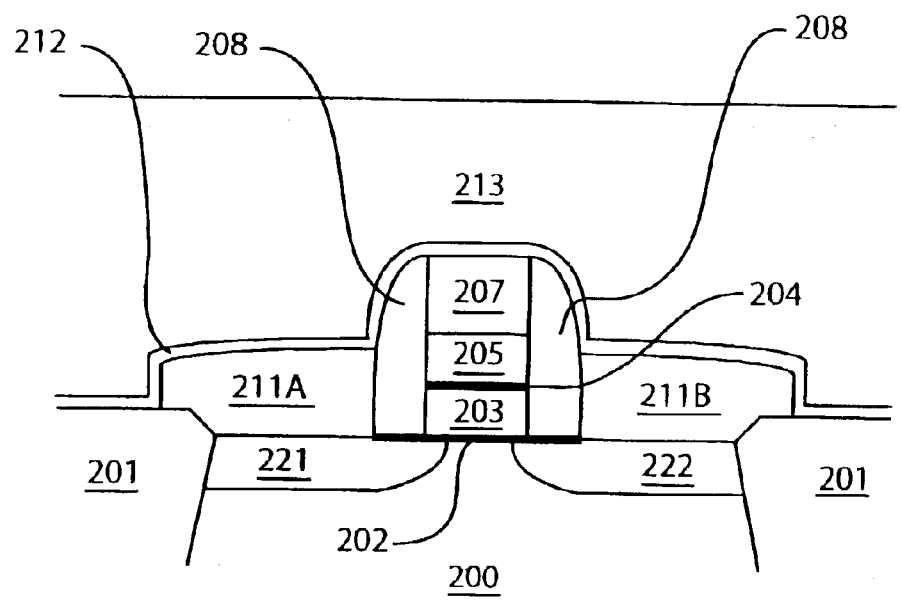

Continuing in FIG. 2(f), a liner 212 may be optionally formed over the sample of FIG. 2(e). Liner 212 helps protect underlying layers, and may also serve as an etch stop for the subsequent self-aligned contact etch. Liner 212 may comprise silicon nitride deposited to a thickness of about 200 Angstroms using a low pressure chemical vapor deposition (LPCVD) process. The LPCVD process is preferably performed at a relatively low-temperature (e.g. about 600° C. or less, preferably about 550° C.) to prevent unwanted reactions in an underlying metal layer 205 of tungsten and raised structures 211 of selective tungsten.

Also in FIG. 2(f), a dielectric layer 213 is formed over liner 212. In one embodiment, dielectric layer 213 comprises phosphosilicate glass (PSG) with a phosphorous content less than about 5%, preferably about 4%. Note that without raised structures 211, the phosphorous content of the PSG many need to be as high as 10% to facilitate formation of polymers, which tend to protect substrate 200 and isolation structures 201 during formation of self-aligned contact structures. However, the relatively high phosphorous content (and the polymer formation itself) may lead to other problems such as incomplete etching of self-aligned contact structures and hollowing (also referred to as "elephant foot" or "caves") in the PSG layer near the bottom of the self-aligned contact structures. In addition, to prevent wafer absorption due to the high phosphorous content, a capping layer of undoped oxide may need to be formed over the PSG layer. Raised structures 211 advantageously protect substrate 200 and isolation structures 201, thus obviating the need for a PSG layer with a relatively high phosphorous content.

In one embodiment, dielectric layer 213 comprises a layer of PSG deposited to a thickness of about 6500 Angstroms by high density plasma chemical vapor deposition (HDP-CVD). Dielectric layer 213 may be planarized to a thickness of about 4000 Angstroms by chemical-mechanical polishing (CMP).

Figure 2G:
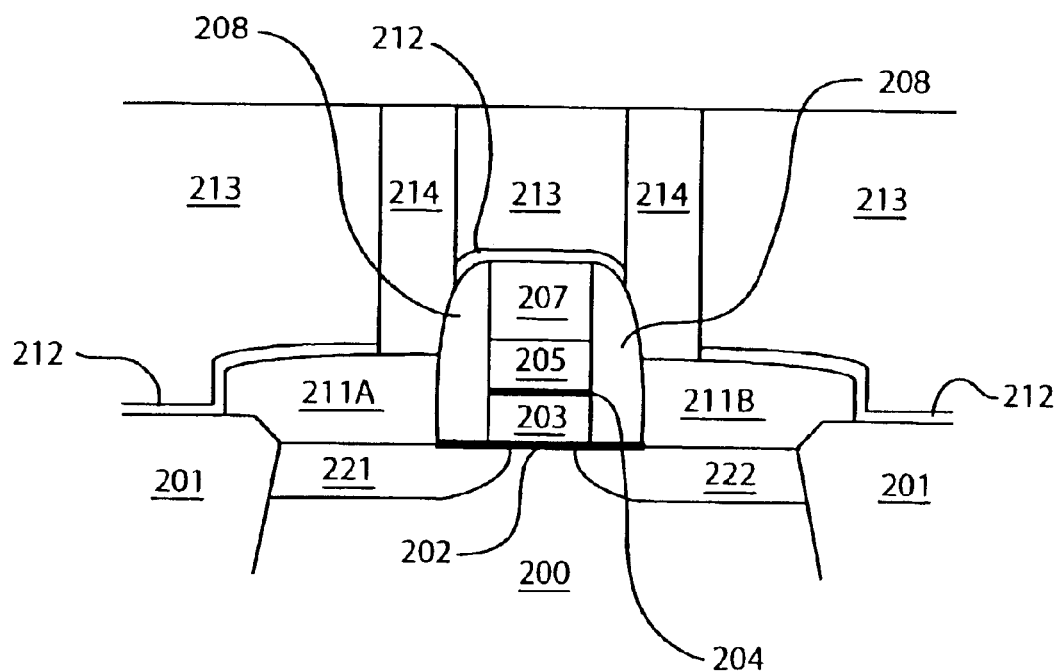

In FIG. 2(g), self-aligned contact (SAC) structures 214 are formed through dielectric layer 213 and liner 212. SAC structures 214 are subsequently filled with a plug material to allow an overlying structure to make an electrical connection with a raised structure 211. SAC structures 214 may be formed by etching through a dielectric layer 213 of PSG using chemistry comprising $CHF_3$, $C_2H_2F_4$ and Ar. Liner 212, if present, may be removed in a cleaning step prior to depositing a liner on the sidewalls and bottom of SAC structures 214.

SAC structures 214 advantageously allow for some misalignment. That is in contrast to other types of contact structures, portions of SAC structures 214 may be over portions of the gate stack, isolation structures 201, or both. For example, portions of a SAC structure 214 may touch portions of capping layer 207 (an electrical insulator) without creating an electrical short to metal layer 205.

SAC structures 214 may be cleaned using a solvent referred to as "EKC" cleaning solution. EKC cleaning solution is commercially available from EKC Technology of Danville, Calif. After an EKC cleaning step, the surfaces of raised structures 211 that are exposed through SAC structures 214 may be further cleaned using a solution of sulfuric acid devoid of hydrogen peroxide.

Figure 2H:
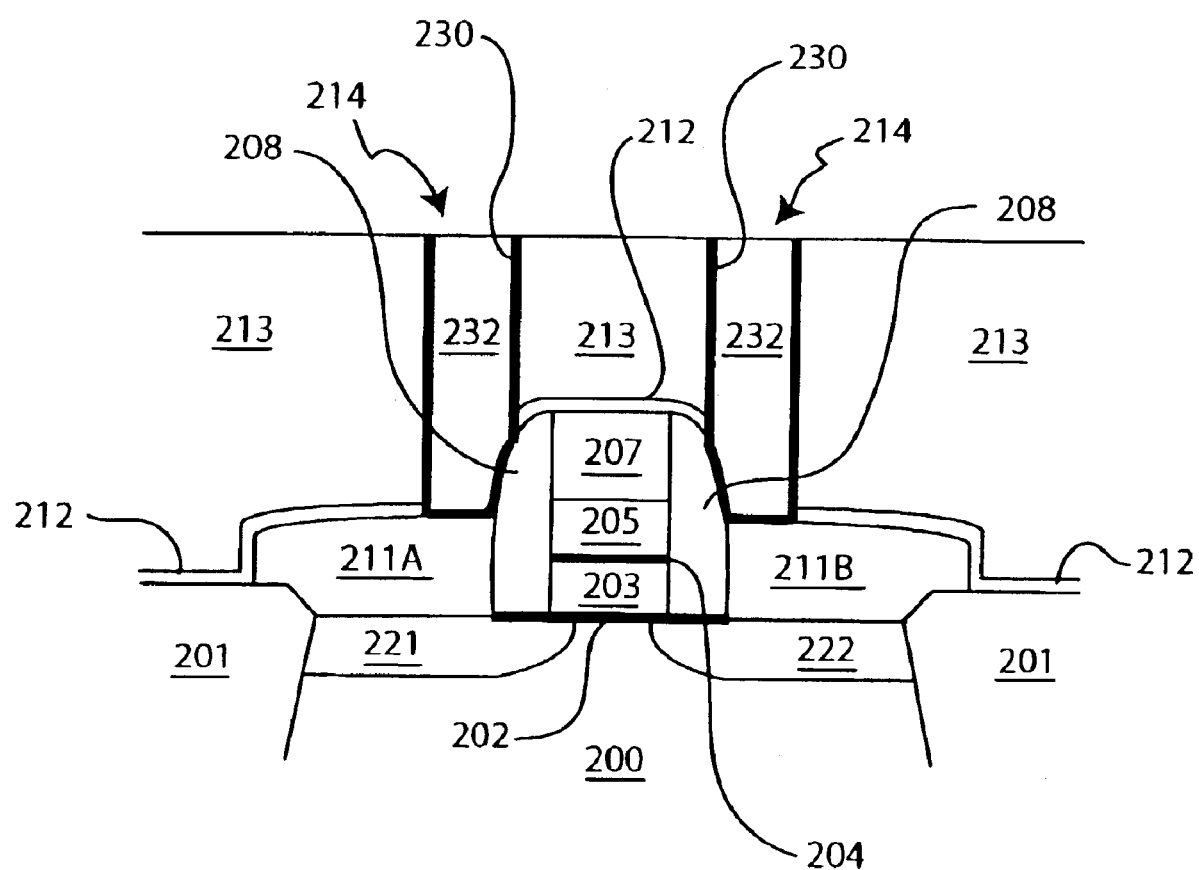

In FIG. 2(h), a liner 230 is formed on the sidewalls and bottom of SAC structures 214. Liner 230 may comprise a titanium/titanium-nitride layer deposited by physical vapor deposition, for example. Liner 230 may be deposited with relatively good step coverage because the aspect ratio of SAC structures 214 has been decreased by the formation of raised structures 211.

Also in FIG. 2(h), SAC structures 214 are filled with a plug 232. Plug 232 may comprise tungsten deposited by chemical vapor deposition (CVD). Thereafter, an overlying structure (not shown) may be formed over a SAC structure 214 to make an electrical connection with a raised structure 211. For example, an overlying interconnect line may be coupled to raised source structure 211A by way of a SAC structure 214.

While specific embodiments of the present invention have been provided, it is to be understood that these embodiments are for illustration purposes and not limiting. Many additional embodiments will be apparent to persons of ordinary skill, in the art reading this disclosure.

What is claimed is:

1. A method of forming a transistor, the method comprising:
   selectively depositing a metal to form a raised source structure over a source region and a corner portion of an isolation structure; and
   forming a first self-aligned contact structure through a dielectric layer, the first self-aligned contact structure being coupled to the raised source structure and being self-aligned such that a portion of the first self-aligned contact structure can be directly over a gate structure without forming an electrical short to a metal layer of the gate structure.

2. The method of claim 1 wherein selectively depositing the metal also forms a raised drain structure over a drain region.

3. The method of claim 2 further comprising:
   forming a second self-aligned contact structure through the dielectric layer, the second self-aligned contact structure being coupled to the raised drain structure.

4. The method of claim 1 further comprising:
   prior to forming the first self-aligned contact structure, forming a liner over the raised source structure.

5. The method of claim 1 wherein the dielectric layer comprises phosphosilicate glass (PSG) having a phosphorous content less than about 5%.

6. The method of claim 1 wherein the gate structure comprises:
   a polysilicon layer over a substrate, the metal layer being over the polysilicon layer;
   and a capping layer over the metal layer.

7. The method of claim 6 wherein the capping layer comprises silicon nitride and the metal layer comprises tungsten.

8. The method of claim 1 wherein the selectively deposited metal comprises selectively deposited tungsten.

9. A method of forming a transistor, the method comprising:
- forming a gate over a substrate;
- implanting a dopant on the substrate to form a source region;
- selectively forming a first raised metal structure over the source region and a corner portion of a first isolation structure;
- forming a dielectric layer over the first raised metal structure and the gate;
- forming a self-aligned contact structure through the dielectric layer; and
- filling the self-aligned contact structure with an electrically conductive plug, the plug being coupled to the first raised metal structure, the self-aligned contact structure being self-aligned such that a portion of the self-aligned contact structure can be directly over the gate without causing an electrical short between the plug and a metal layer of the gate.

10. The method of claim 9 wherein the first raised metal structure comprises selective tungsten.

11. The method of claim 9 further comprising:
- selectively forming a second raised metal structure over a drain region and a corner portion of a second isolation structure.

12. A method of forming a transistor, the method comprising:
- forming a gate over a substrate, the sate comprising a gate polysilicon layer over a gate oxide layer, a barrier layer over the gate polysilicon layer, a metal layer over the barrier layer, and a capping layer over the metal layer;
- selectively forming a raised metal structure over a first region on the substrate and a corner portion of an isolation structure;
- forming a dielectric over the first region; and
- forming a self-aligned contact structure through the dielectric, the self-aligned contact structure being self-aligned such that a portion of the self-aligned contact structure can be directly over the gate without creating an electrical short to the metal layer.

13. The method of claim 12 further comprising:
- filling the self-aligned contact structure with a plug to allow an overlying structure to make an electrical connection with the raised structure.

14. The method of claim 12 wherein the raised metal structure is formed by depositing tungsten selective to silicon versus silicon dioxide.

15. The method of claim 12 wherein the raised metal structure is formed by depositing tungsten selective to silicon versus silicon nitride.

16. The method of claim 12 wherein the raised metal structure comprises selective tungsten.

* * * * *